United States Patent
Shen et al.

(10) Patent No.: US 6,829,751 B1
(45) Date of Patent: Dec. 7, 2004

(54) DIAGNOSTIC ARCHITECTURE USING FPGA CORE IN SYSTEM ON A CHIP DESIGN

(75) Inventors: Zhaohui Shen, Santa Clara, CA (US); Daniel Watkins, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 452 days.

(21) Appl. No.: 09/684,868

(22) Filed: Oct. 6, 2000

(51) Int. Cl.[7] ................ G06F 17/50; H03K 17/693
(52) U.S. Cl. ........................................ 716/4; 716/16
(58) Field of Search .................... 716/1, 4–5, 16–18; 714/725–727, 30, 37

(56) References Cited

U.S. PATENT DOCUMENTS

| | | | |
|---|---|---|---|
| 5,497,378 A | * 3/1996 | Amini et al. | 714/727 |
| 5,588,152 A | * 12/1996 | Dapp et al. | 712/16 |
| 6,134,676 A | * 10/2000 | VanHuben et al. | 714/39 |
| 6,434,735 B1 | 8/2002 | Watkins | 716/16 |
| 6,467,009 B1 | * 10/2002 | Winegarden et al. | 710/305 |
| 6,477,683 B1 | * 11/2002 | Killian et al. | 716/1 |

* cited by examiner

*Primary Examiner*—Matthew Smith
*Assistant Examiner*—Paul Dinh
(74) *Attorney, Agent, or Firm*—Christopher P. Maiorana, P.C.

(57) ABSTRACT

A system for designing an integrated circuit (IC). The system generally comprising a circuit and a programmable portion used for diagnostics and finding bugs. The circuit generally comprises (i) a functional portion and (ii) a logic portion that may be connected to the functional portion. The logic portion generally includes one or more interfaces. The programmable portion may be configured to detect, correct and/or diagnose errors in the logic portion through the one or more interfaces.

22 Claims, 5 Drawing Sheets

DIAGNOSTIC ARCHITECTURE USING FPGA CORE IN SYSTEM ON A CHIP DESIGN

FIELD OF THE INVENTION

The present invention relates to a method and/or architecture for a Field Programmable Gate Array (FPGA) core generally and, more particularly, to a diagnostic method and/or architecture using an FPGA core in a system on a chip (SOC) design.

BACKGROUND OF THE INVENTION

A number of conventional approaches to chip design include (i) directly connecting internal signals to chip I/O pins using multiple layers of multiplexers; (ii) reading on-chip readable registers through host interfaces; (iii) running resistor-transistor logic (RTL) simulations to create special cases to find bugs and verify a fixed solution; and (iv) using emulators to verify the design.

The first conventional approach is limited by the number of the chip I/O pins that can be used to access the internal signals. For example, with 2 layers of 8 to 1 multiplexers, up to 8 signals are needed to be probed simultaneously, totaling 3+3+8=14 I/O pins that are needed for the design. With chip gate counts over 1 million gates, good coverage is difficult to achieve with such an approach.

The second conventional approach can only capture a snap shot of the on-chip readable registers. While such an approach can be helpful in identifying the existence of a bug, it does not offer enough information to precisely locate the bug. Additionally, special effort is needed in the design phase to organize all of the registers.

The third conventional approach can access all the chip internal signals, but has drawbacks. First, such an approach is a software simulation approach that is very time consuming. The simulation speed is usually thousands of times slower than the real system. Second, since such an approach is a software simulation method, it cannot reflect all the factors in the real system. Third, some bugs may not be uncovered with the RTL simulation method because of the running time limitation or the difficulty in creating the simulation case.

The fourth conventional approach can run at a speed up to 1 MHz. However, the emulator is very expensive (i.e., about $1 per gate). Implementing such an emulator is not easily accomplished. Additionally, the verification cost can be very high.

Therefore, it would be desirable to provide a system for chip design that would minimize the drawbacks associated with conventional systems.

SUMMARY OF THE INVENTION

The present invention concerns a system for designing an integrated circuit (IC). The system generally comprising a circuit and a programmable portion used for diagnostics and finding bugs. The circuit generally comprises (i) a functional portion and (ii) a logic portion that may be connected to the functional portion. The logic portion generally includes one or more interfaces. The programmable portion may be configured to detect, correct and/or diagnose errors in the logic portion through the one or more interfaces.

The objects, features and advantages of the present invention include providing a method and/or architecture for implementing a diagnostic architecture using an FPGA core in a system on-chip design that may (i) ease bringing up, verification and debugging by providing interconnection and programming options; (ii) observe important signals while the chip is running under a normal mode; (iii) run at a single step mode while under the control of the FPGA core; (iv) display appropriate signals on a debugging workstation, allowing many debugging features to be supported such as: (a) triggering and tracing based on internal signals, (b) dynamically changing host register values and (c) providing complex monitoring functions, since the FPGA is programmed; (v) reduce debugging/verification time and/or (vi) improve product time to market.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

With the exponential increase of the number of transistors integrated on a single chip, diagnostics of the chip becomes more and more challenging. Better accessibility to internal signals of the chip is highly demanded.

The present invention implements an FPGA core as an embedded Field Programmable Gate Array core that may be used to enable logic to be programmed after the silicon has been produced. The FPGA core can be used to implement on-chip diagnostics to enable debugging functions, such as bus monitoring, probing, single step running, triggering, capturing, etc. One example of such an FPGA may be found in co-pending application Ser. No. 09/464,741, which is hereby incorporated by reference in its entirety.

Figure 1:
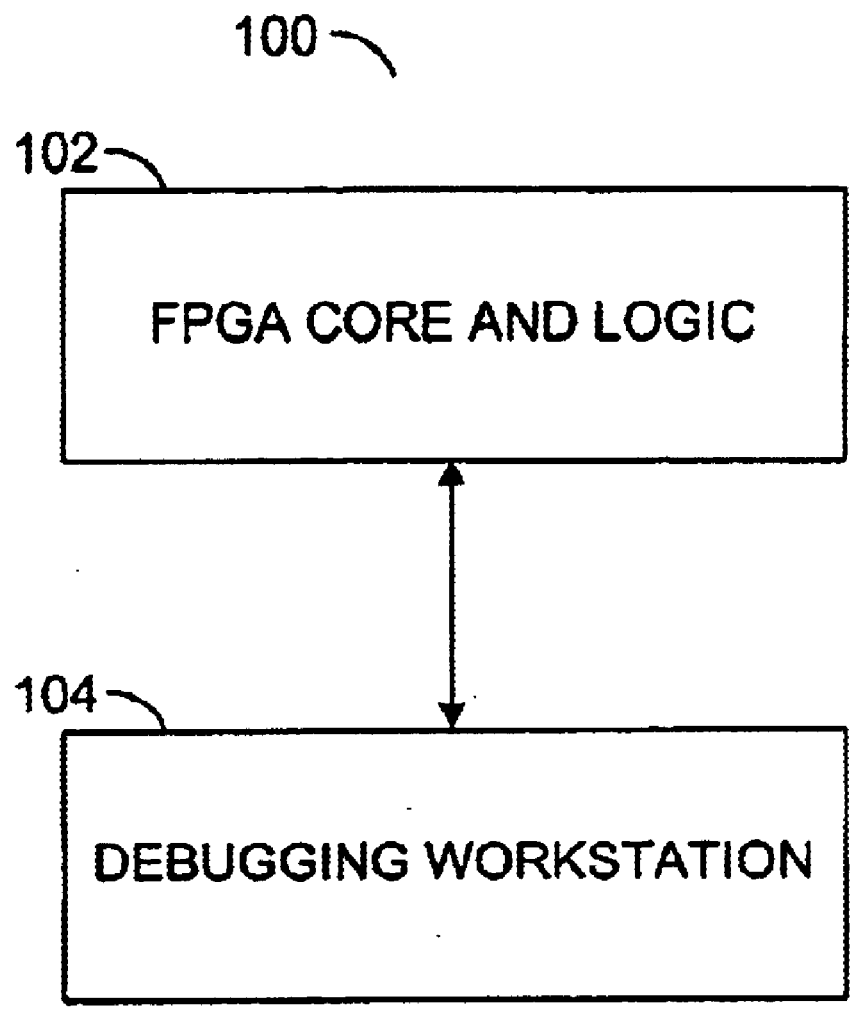
FIG. 1 is a block diagram of a preferred embodiment of the present invention.

Referring to FIG. 1, a diagram of a system 100 is shown in accordance with the preferred embodiment of the present invention. The system 100 generally comprises an FPGA core and logic block (or circuit) 102 and a debugging workstation block (or circuit) 104. The circuit 102 may be implemented as a single chip or integrated circuit (IC). Additionally, the debugging workstation 104 generally works in combination with the FPGA core and logic block 102.

The system 100 generally allows for design of an integrated circuit (IC). The circuit 102 generally comprises a functional portion that varies with design and a logic portion connected to the functional portion (to be discussed in connection with FIGS. 2 and 3). The logic portion generally includes one or more interfaces that may be coupled to the debugging circuit 104. The debugging circuit 104 may be configured to detect errors in the logic portion through the one or more interfaces.

Figure 2:
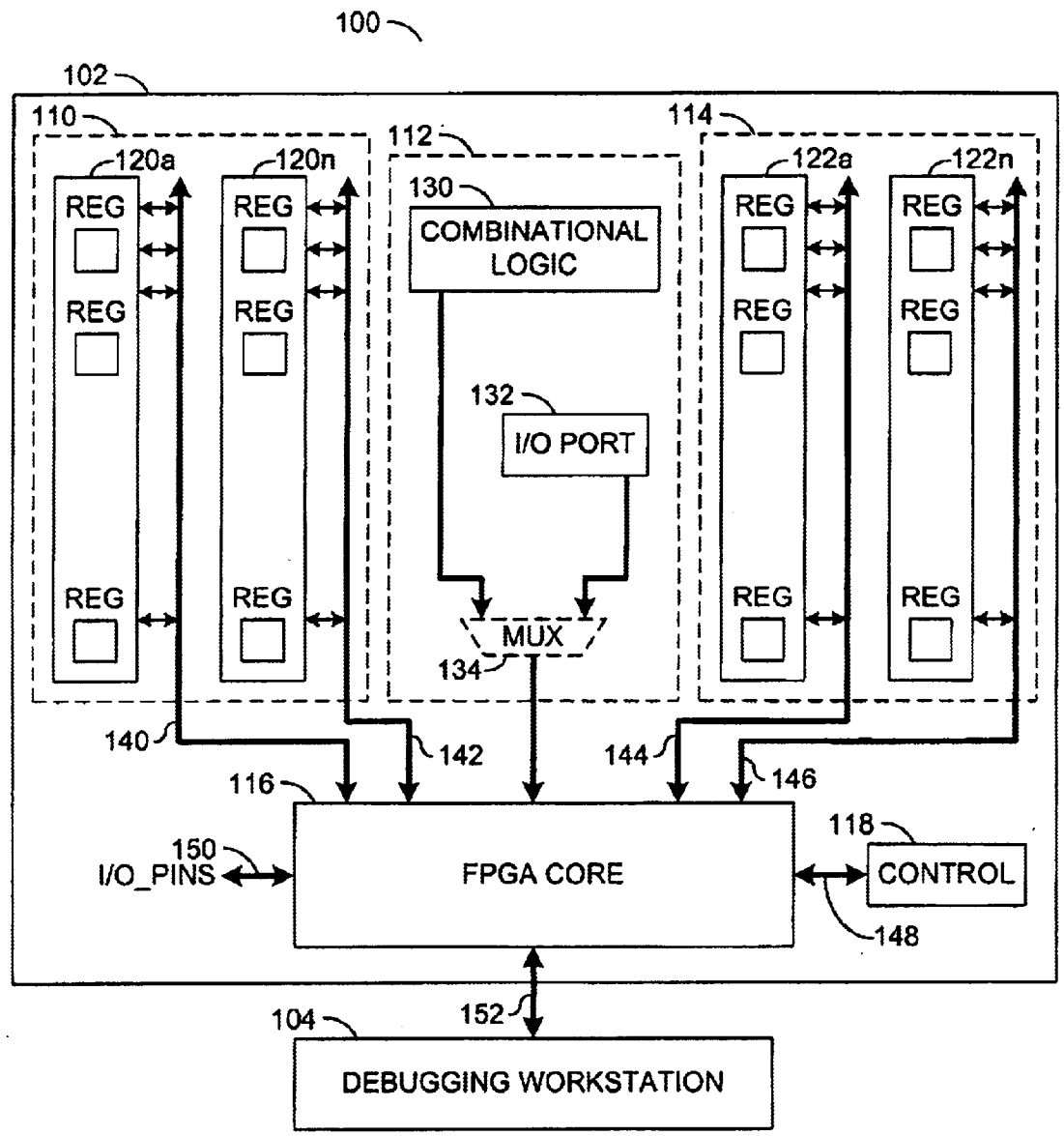
FIG. 2 is a more detailed block diagram of the present invention.

Referring to FIG. 2, a more detailed block diagram of the FPGA core and logic block 102 is shown. The FPGA core and logic block 102 generally comprises a register portion 110, a logic portion 112, a register portion 114, an FPGA core portion 116 and a control port on 118. The FPGA core 116 may be implemented to control the chip 102. The register portion 110 generally comprises a number of register blocks 120a–120n. The register portion 114 generally comprises a number of register blocks 122a–122n. The logic block 112 generally comprises a combinational logic block (or circuit) 130, an I/O block (or circuit) 132 and a multiplexer circuit 134. A particular implementation of the multiplexer 134 may be varied in order to meet the criteria of a particular implementation.

The register block 110 may communicate with the FPGA core 116 through a bus 140 and a bus 142. Similarly, the register block 114 may also communicate with the FPGA core 116 through a bus 144 and a bus 146. The buses 140, 142, 144 and 146 may be implemented, in one example, as multi-bit buses. However, the buses 140, 142, 144 and 146 may also be implemented as single bit buses, if appropriate. Additionally, the buses 140, 142, 144 and 146 may also be implemented as bidirectional buses.

The FPGA core 116 may also communicate with the control block 118 through a bus 148. The FPGA core 116 may communicate through a number of I/O pins (e.g., I/O_PINS) over a bus 150. The FPGA core 116 may also communicate with the debugging workstation 104 through a bus 152. The buses 148, 150 and 152 may be implemented as single bit buses or multi-bit buses. Additionally, the buses 148, 150 and 152 may be implemented as bidirectional buses.

The system 100 may provide a chip diagnostics architecture by implementing the FPGA core 116. By using the FPGA core 116 to implement such chip diagnostics, simultaneous probing of internal signals can be achieved while the system 100 is running under predetermined conditions (e.g., a normal mode of operation). Additionally, a process may be implemented to allow the FPGA core 116 to collect data from the registers 120a–120n and 122a–122n using a scan chain, while the system 100 is running under predetermined conditions (e.g., a step mode configuration) controlled by the FPGA core 116.

With the FPGA core 116 running at a speed much faster than a clock of the system 100, data collecting from the internal signals can be done while the system 100 is running in the normal mode. For example, in consumer products, devices typically only run at 27 MHz, while the FPGA core 116 can operate at as fast as 200 MHz to 400 MHz, or even higher. The FPGA core 116 can be programmed to simultaneously probe multiple internal signals that are connected to the I/O block 132 while the system 100 is running at a normal operational speed. After the data is collected and compressed, the data will be sent to the debugging workstation 104. The waveforms of the internal signals under probing can be displayed as if they are directly connected to a logic analyzer by internal wires (via the debugging workstation 104).

The FPGA core 116 may be implemented to support up to 1K of I/O data. Therefore, up to 1K of internal signal probing can be supported simply by directly connecting the signals to the I/O_PINS of the FPGA core 116. Multiplexing (e.g., through the multiplexer 134) may also be implemented to increase an amount of I/O data. For example, if 2 layers of 8 to 1 multiplexers are used, up to 64K of internal signal probing may be supported. Additionally, multiplexers may allow the circuit 100 to drastically reduce the number of internal connection wires. The particular number of I/Os supported by the FPGA core 116 as well as the particular number of multiplexers may be varied to meet the design criteria of a particular implementation.

By controlling the system clock, the FPGA core 116 may also be programed to run the system 100 in a single step mode. By utilizing the scan chain under the single step mode, the FPGA core 116 may collect data from the register blocks 110 and 114 implemented on the system 100. Since the scan chain is usually very long (e.g., several thousands of registers per scan chain), the scan chain may be separated into small segments to speed up data collection.

Figure 3:
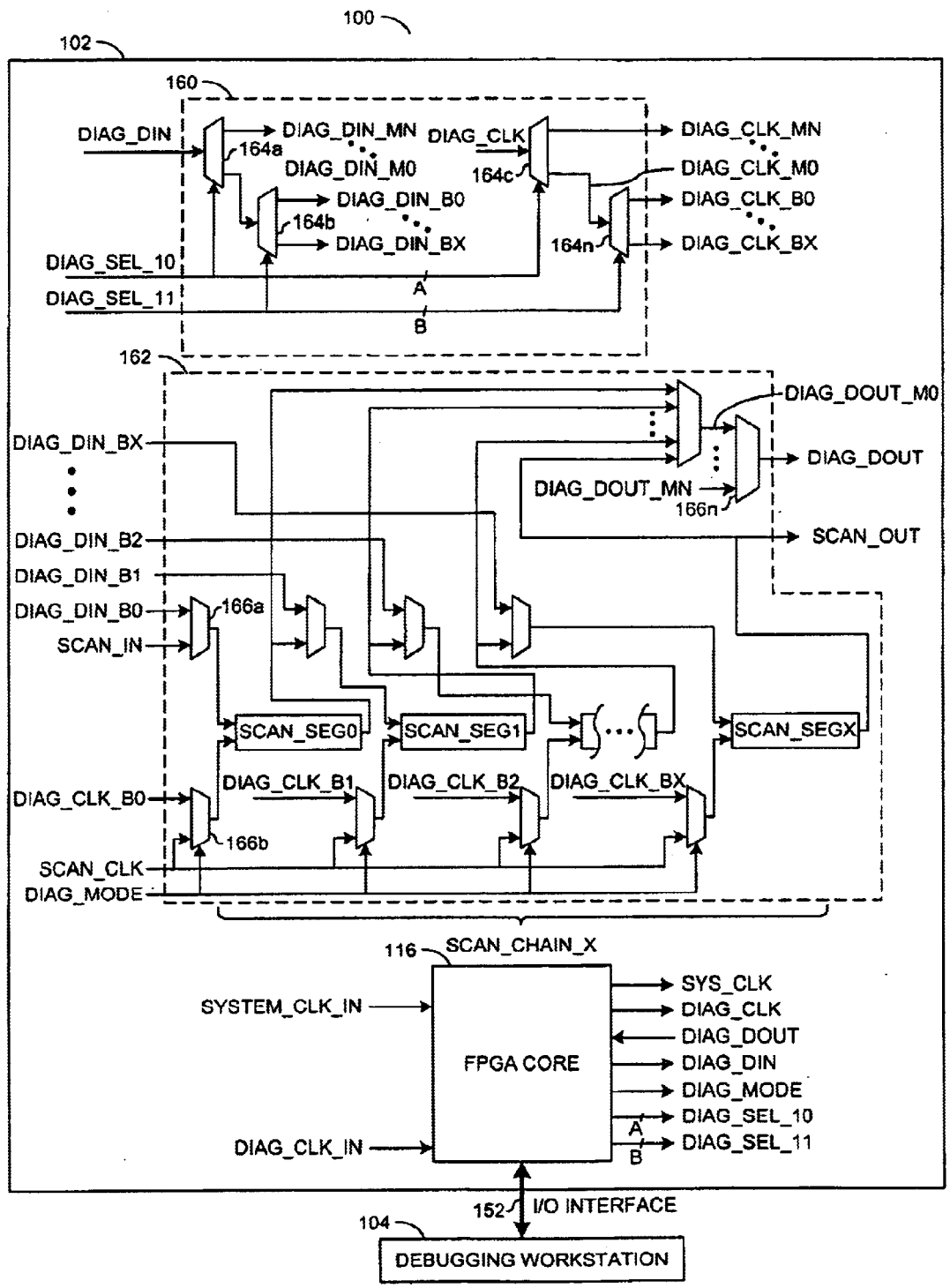
FIG. 3 is an even more detailed block diagram of the present invention.

Referring to FIG. 3, a diagram illustrating the breaking of a scan chain into segments is shown. The scan chain implementation of the circuit 102 generally comprises a multiplexer logic block (or circuit) 160 and a scan chain segment block (or circuit) 162. The multiplexer logic block 160 generally comprises a number of multiplexers 164a–164n. The scan chain segment block 162 generally comprises a number of multiplexers 166a–166n and a number of scan chain segments (e.g., SCAN_SEG0, SCAN_SEG1 . . . SCAN_SEGX). The scan chain segments may allow the FPGA core 116 select and collect register data more quickly.

Figure 4:
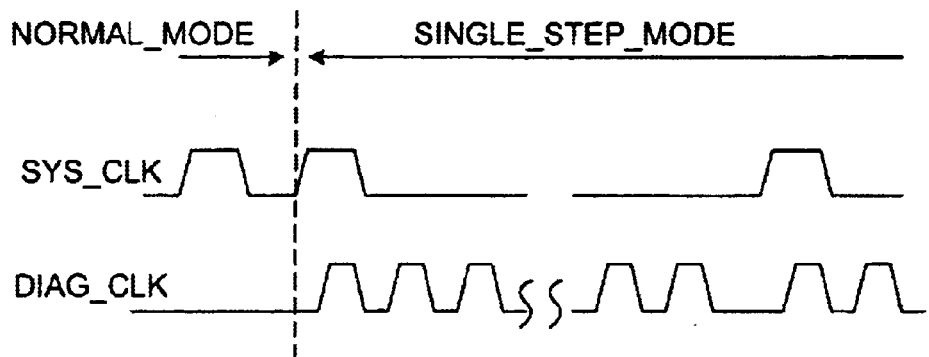
FIG. 4 is a timing diagram illustrating an exemplary operation of the present invention.

FIG. 4 shows the timing relationship between a system clock signal (e.g., SYS_CLK) and a clock signal (e.g., DIAG_CLK). The clock signal DIAG_CLK may be implemented as a diagnostic clock. The FPGA core 116 may control the diagnostic clock signal DIAG_CLK. The system clock signal SYS_CLK may be implemented during the normal mode. The diagnostic clock signal DIAG_CLK may be implemented during the single step mode. Both the clock signal SYS_CLK and the clock signal DIAG_CLK are derived from the FPGA core 116.

The following steps outline collecting of register data using the segmented scan chain under single step mode:

(i) by programming the FPGA core 116, the debug workstation 104 may increase a particular number of registers on the chip 100 that need to be observed as well as the observation start and stop times of the particular registers;

(ii) during the observation start and stop time, the chip 100 may operate under the single step mode;

(iii) the FPGA core 116 generates the clock signal SYS_CLK, the clock signal DIAG_CLK and select signals DIAG_SEL10 and DIAG_SEL11 (which may be multi-bit or single bit signals) to control which scan segments need to be accessed;

(iv) under the single step mode, after each effective edge of the system clock SYS_CLK, the data in the selected scan segments SCAN_SEG0-SCAN_SEGX may be shifted to the FPGA core 116, then shifted back to the selected scan segment SCAN_SEG0-SCAN_SEGX, and then the clock signal SYS_CLK may resume; and (v) only the data from the registers that needs to be monitored may be stored and compressed. The I/O interface may then transfer the data to the debugging workstation 104.

Figure 5:
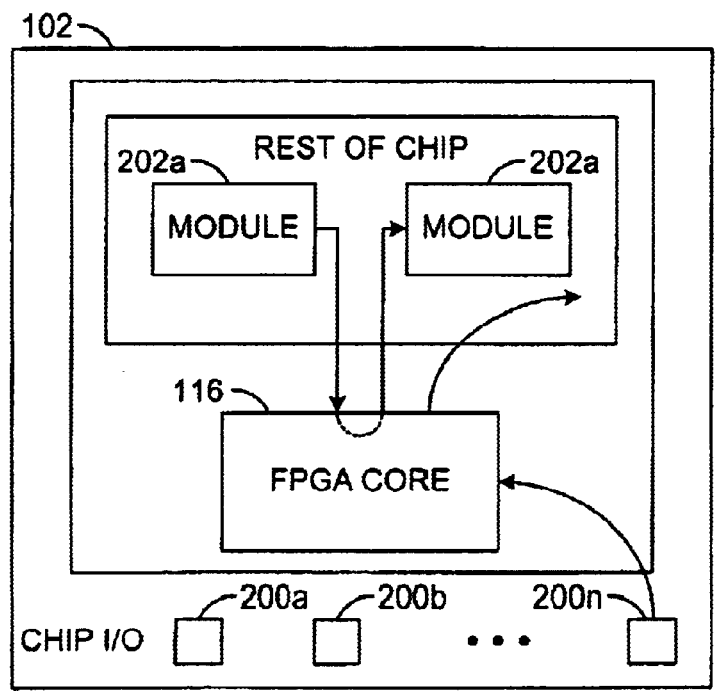
FIG. 5 is an example of an implementation of the present invention on a chip.

Referring to FIG. 5, one or more chip I/O pins 200a–200n are shown connected to the FPGA core 116. Such a connection can allow the FPGA core 116 to monitor the I/O of the chip 102. In addition, one of the I/O pins 200a–200n can be connected as an input pin to the FPGA core 116. An internal module from the FPGA core 116 may generate a signal to drive the chip during the chip debugging. With a system on chip design, the signals among different blocks can also be connected through the FPGA core 116.

Additionally, the FPGA core 116 can bridge signals between different modules 202a–202n. Such bridging can help in debugging of different modules. Such bridging can also help in isolating problems.

For those modules 202a–202n that are sensitive to the clock frequency, such as the refresh control block in an DRAM/SRAM interface (not shown), the FPGA core 116 can keep these modules running at normal clock speed. However, special attention needs to be paid during the design phase, to make the whole system work normally while the system clock is slowed down during the step running mode.

Computer Aided Design (CAD) software may also need to be developed for the debugging workstation 104. The debug workstation 104 can be developed to work together with the on-chip FPGA core 116. The functions of the debug workstation include one or more of the following:

(i) programming the FPGA core to implement user required functions, (ii) collecting data from the FPGA core though the I/O interface, and (iii) offering an end user interface to the debugging engineer.

One function of such software may be to offer an easy to use interface to the user.

Figure 6:
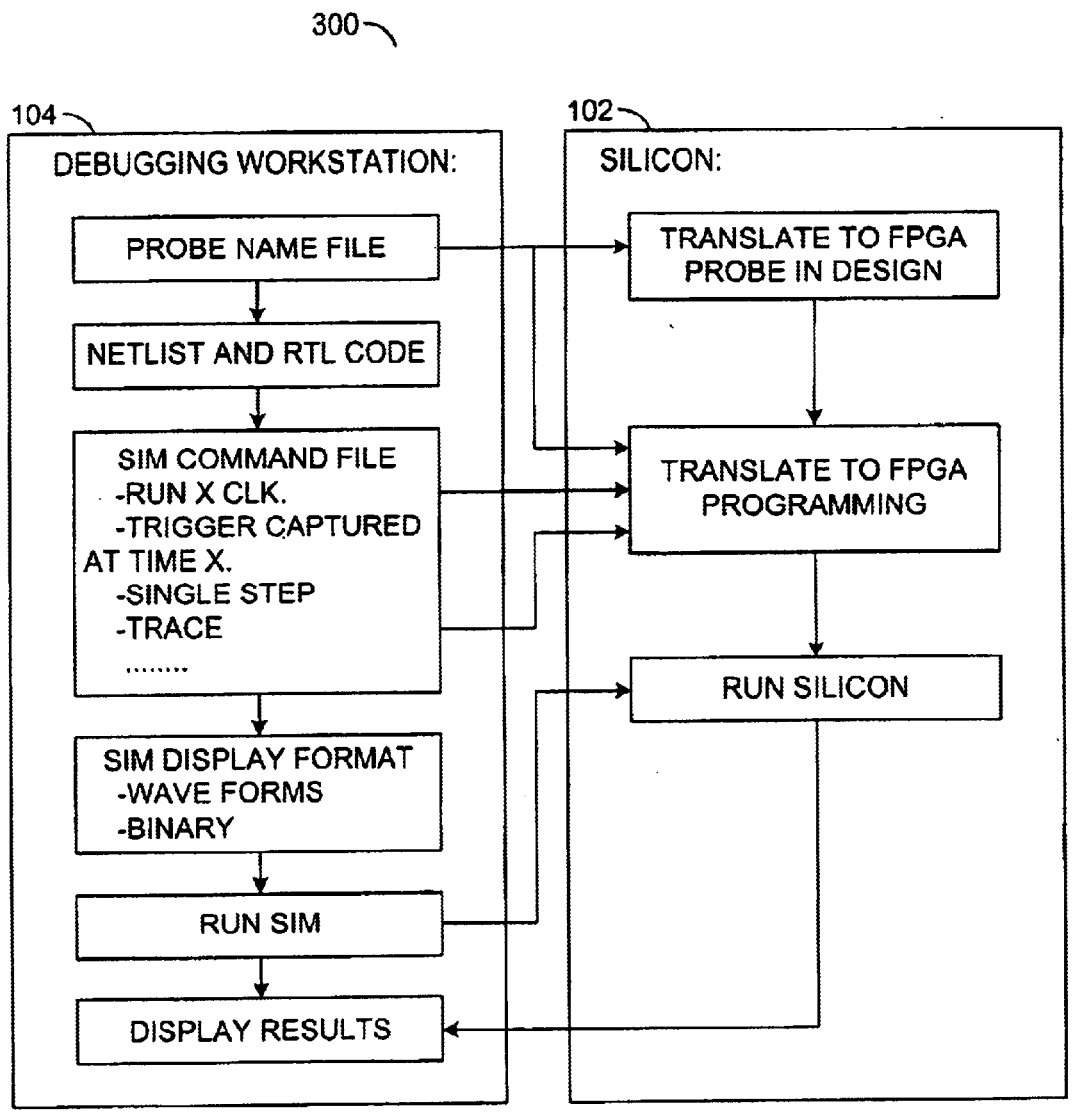
FIG. 6 is another implementation of the present invention.

Referring to FIG. 6, a work flow (or system) 300 of an example software is shown. The software will read in the probe name file, in which all the signals that can be probed are logged. The netlist file and the RTL codes of the design are read. All the registers on different scan segments are mapped to the netlist and related to the RTL codes. In this way, the user can easily decide which signals need to be observed during the debugging period. While the chip 102 is running at normal speed, the software can display any of the internal signals that are connected to the I/O of the FPGA core 116. While the chip 102 is running at single step mode, the software can display all the signals on the chip 102. This is because under single step mode, the FPGA core 116 can be programmed to access any of the on-chip registers. All the combinational signals can be derived from the related register values and the netlist information. By using such software, users can also program the FPGA core 116 to implement different debugging functions. The debugging workstation 104 and the CAD software can be reused in different projects, resulting in reduction of cost.

The function performed by the system 300 of FIG. 6 may be implemented using a conventional general purpose digital computer programmed according to the teachings of the present specification, as will be apparent to those skilled in the relevant art(s) Appropriate software coding can readily be prepared by skilled programmers based on the teachings of the present disclosure, as will also be apparent to those skilled in the relevant art(s).

The present invention may also be implemented by the preparation of ASICS, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

With the on-chip programming capability of the FPGA core 116 and the debugging software, many new features can be implemented without increasing the cost in diagnostics. Such may include one or more of the following:

(i) programming the FPGA core 116 to dump the host register every N clock cycles, (ii) capturing signals every N clock cycles, (iii) dynamically changing the host register values, (iv) single step tracing, counters and pointers monitoring, (v) searching for a specific signal pattern, (vi) tracing an internal state machine triggered on a programmed condition, (vii) monitoring the correctness of a bus protocol, and/or (viii) implementing statistics counting to measure the performance (e.g., the active time on bus request, the execution coverage of the internal state machines, etc.)

Individual aspects described can be implemented either alone or in combination. For example, only particularly important signals may need to be connected to the FPGA core 116 for real time monitoring. The present invention may provide a FPGA core in an ASIC architecture that eases chip bring up, verification and debugging by interconnection and programming options. The present invention may allow important signals of a chip to be observed while the chip is running under a normal mode by connecting the internal signals to the FPGA core I/O. The present invention may allow all the signals of the chip to be displayed while the chip is running under a single step mode by allowing a FPGA core to control the chip.

By programming the FPGA core 116, many debugging features can be supported, such as one or more of the following:

(i) programmed triggering and tracing based on internal signals (e.g., tracing the internal state machines, pointers, counters, etc.)

(ii) triggering on the specific values of address, data, or command bus;

(iii) dynamically changing the host register values; and/or (iv) complex monitoring functions (e.g., protocol monitoring). Additionally, the system 100 may reduce chip debugging/verification time and product time to market.

The FPGA core 116 may simultaneously probe multiple internal signals. By utilizing the scan chain under the single step mode and with the on-chip FPGA core 116 acting as the data process center, all the signals on the chip 102 can be observed. The FPGA core 116 can be used to bridge the signals between different modules, and the under test mode, to isolate a specific module and drive signals to test the specific module. The FPGA core 116 can also be used to add or verify bug fixes. The process of the debugging workstation 104 working with the on-chip FPGA core 116 to generate many powerful debugging features may also be implemented.

The system 100 may provide functionality of a CAD software that may be implemented to work with the diagnostics design. The system 100 may allow for enhanced debugging capabilities with the diagnostics design, such as searching for a specific signal pattern, tracing the internal state machine and/or triggering on a programmed condition. The system 100 may provide on the fly monitoring of the correctness of the bus protocol, doing statistics counting to measure the performance and/or testing coverage.

While the invention has been particularly shown and described with reference to the preferred embodiments thereof, it will be understood by those skilled in the art that various changes in form and details may be made without departing from the spirit and scope of the invention.

What is claimed is:

1. A system for designing an integrated circuit (IC) comprising:

a functional portion comprising an FPGA core;

a logic portion (i) connected to said functional portion and ii) configured to (a) detect errors when in a first mode, (b) fix errors when in a second mode and (c) verify fixes of errors in said functional portion when in a third mode, wherein said logic portion includes one or more interfaces;

a debugging/bug fix circuit configured to detect errors in said logic portion through said one or more interfaces; and a diagnostic architecture using said FPGA core in a system on a chip design.

2. The system according to claim 1, wherein said system is further configured to (i) provide ease in bringing up, (ii) verification and (iii) debugging, each by interconnecting said circuit and said debugging/bug fix circuit.

3. The system according to claim 1, wherein said system is further configured to provide one or more programming options of said circuit.

4. The system according to claim 1, wherein said system is further configured to allow observation of one or more signals by said debugging/bug fix circuit.

5. The system according to claim 4, wherein said system is further configured to allow observation of said one or more signals when running in a normal mode.

6. The system according to claim 1, wherein said system is further configured to run in a single step mode.

7. The system according to claim 6, wherein said system is further configured to run in said single step mode when controlled by a gate or a core.

8. The system according to claim 7, wherein said core is programmable.

9. The system according to claim 1, wherein said debugging/bug fix circuit comprises a debugging workstation.

10. The system according to claim 1, wherein said debugging/bug fix circuit is further configured to allow one or more debugging features.

11. The system according to claim 10, wherein said one or more debugging features support triggering and tracing based on one or more internal signals.

12. The system according to claim 10, wherein said one or more debugging features support dynamically changing host register values.

13. The system according to claim 10, wherein said one or more debugging features provide complex monitoring functions.

14. The system according to claim 1, wherein said system is further configured to reduce debugging/verification time and/or improve product time to market.

15. The system according to claim 1, wherein said circuit is further configured to operate in a normal mode and a single step mode.

16. The system according to claim 15, wherein said normal mode is configured to allow said circuit to present one or more internal signals of said functional portion and said single step mode is configured to provide a plurality of signals of said functional portion.

17. The system according to claim 16, wherein the logic portion is further configured to bridge one or more of said plurality of signals between a plurality of modules.

18. The system according to claim 15, wherein a scan chain is used to diagnose or fix a bug via the logic portion.

19. The system according to claim 1, wherein said debugging/bug fix circuit and said circuit are configured to generate one or more debugging features.

20. The system according to claim 1, wherein said debugging/bug fix circuit is configured to work with Computer Aided Design (CAD) software to provide one or more diagnostic functions.

21. The system according to claim 20, wherein said diagnostic functions are selected from the group consisting of searching for a specific signal pattern, triggering on a programmed condition and other appropriate diagnostic functions.

22. The system according to claim 20, wherein said diagnostic functions are selected from the group consisting of on the fly monitoring of a correctness of a bus protocol, and implementing statistics counting to measure performance and testing coverage.

* * * * *